US006667998B1

(12) United States Patent
Lo et al.

(10) Patent No.: US 6,667,998 B1
(45) Date of Patent: Dec. 23, 2003

(54) THERMOELECTRIC COOLER LINEARIZATION IN A TUNABLE LASER

(75) Inventors: Jiann-Chang Lo, Cupertino, CA (US); Mark S. Rice, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/396,930

(22) Filed: Mar. 24, 2003

(51) Int. Cl.[7] ................................................ H01S 3/04
(52) U.S. Cl. ........................ 372/34; 372/38.07; 372/98
(58) Field of Search ................ 372/34, 38.07, 372/98

(56) References Cited

U.S. PATENT DOCUMENTS

| | | | | |
|---|---|---|---|---|
| 5,594,746 | A | * | 1/1997 | Harada .......................... 372/22 |
| 5,761,234 | A | * | 6/1998 | Craig et al. .................... 372/75 |
| 6,359,918 | B1 | * | 3/2002 | Bielas ........................ 372/38.01 |
| 6,600,760 | B1 | * | 7/2003 | Green et al. .................... 372/20 |
| 2002/0126345 | A1 | * | 9/2002 | Green et al. ................. 359/122 |
| 2002/0176473 | A1 | * | 11/2002 | Mooradian ..................... 372/92 |
| 2003/0007540 | A1 | * | 1/2003 | Daiber .......................... 372/92 |
| 2003/0012237 | A1 | * | 1/2003 | Tuganov et al. ............... 372/34 |
| 2003/0016706 | A1 | * | 1/2003 | Flint et al. .................... 372/20 |
| 2003/0033819 | A1 | * | 2/2003 | Prescott ......................... 62/3.7 |

* cited by examiner

Primary Examiner—Leon Scott, Jr.
(74) Attorney, Agent, or Firm—Blakely, Sokoloff, Taylor & Zafman LLP

(57) ABSTRACT

A method for tuning a laser via a temperature control loop that linearizes a non-linear characteristic of a thermal electric cooler (TEC) element used to adjust the temperature of tuning components and corresponding laser apparatus. One or more TEC elements are thermally coupled to respective tuning components, such as etalon filters. The TEC elements provide a heat transfer function (cooling rate) in response to a received electrical input (drive signal), wherein the relationship between the cooling rate and the drive signal is non-linear. An un-compensated drive signal produced by the control loop is compensated such that the open loop gain of the control loop is linearized via a linearizer control block. In effect, the non-linear transfer function of the TEC element is cancelled out by the linearizer control block to produce a linear relationship between the cooling rate and the drive signal. This open loop gain linearization enables tuning events such as channel slewing, and laser start-up operations to be performed with reduced tuning overshoots and undershoots that would otherwise result from the non-linear TEC transfer function characteristic.

35 Claims, 8 Drawing Sheets

THERMOELECTRIC COOLER LINEARIZATION IN A TUNABLE LASER

FIELD OF THE INVENTION

The field of invention relates generally to optical communication systems and, more specifically but not exclusively relates to enhanced tunable lasers and methods for providing enhanced channel switching in such tunable lasers.

BACKGROUND INFORMATION

There is an increasing demand for tunable lasers for test and measurement uses, wavelength characterization of optical components, fiberoptic networks and other applications. In dense wavelength division multiplexing (DWDM) fiberoptic systems, multiple separate data streams propagate concurrently in a single optical fiber, with each data stream created by the modulated output of a laser at a specific channel frequency or wavelength. Presently, channel separations of approximately 0.4 nanometers in wavelength, or about 50 GHz are achievable, which allows up to 128 channels to be carried by a single fiber within the bandwidth range of currently available fibers and fiber amplifiers. Greater bandwidth requirements will likely result in smaller channel separation in the future.

DWDM systems have largely been based on distributed feedback (DFB) lasers operating with a reference etalon associated in a feedback control loop, with the reference etalon defining the ITU wavelength grid. Individual DFB transmitters are usable only for a single channel or a small number of adjacent channels.

Continuously tunable external cavity lasers have been developed to overcome the limitations of individual DFB devices. Various laser tuning mechanisms have been developed to provide external cavity wavelength selection, such as mechanically tuned gratings used in transmission and reflection. External cavity lasers must be able to provide a stable, single mode output at selectable wavelengths while effectively suppress lasing associated with external cavity modes that are within the gain bandwidth of the cavity. These goals have been difficult to achieve, and there is accordingly a need for an external cavity laser that provides stable, single mode operation at selectable wavelengths.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified.

DETAILED DESCRIPTION OF PREFERRED EMBODIMENTS

Embodiments of improved methods for tuning discreet channel lasers via linearization of one of more thermoelectric cooler (TEC) servo loops employed by the lasers are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
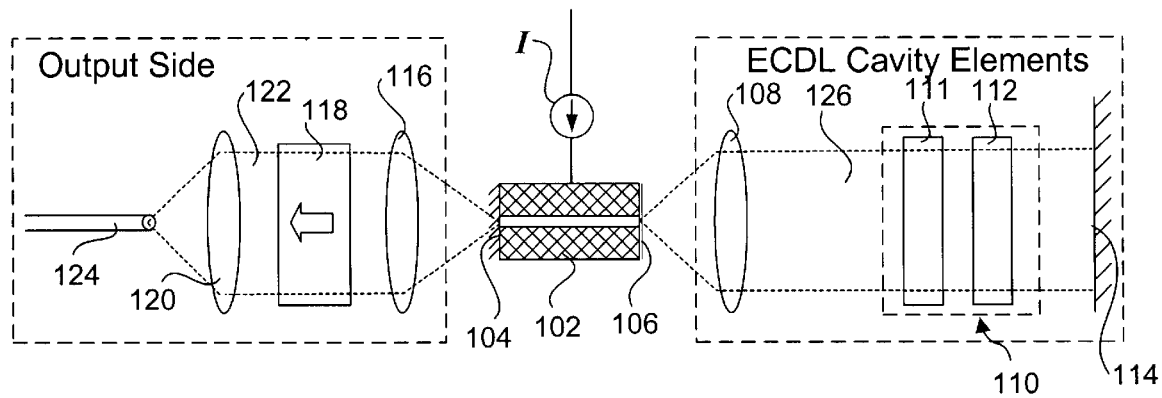
FIG. 1 is a schematic diagram of a generalized external cavity laser for which various embodiment of the invention may be derived in accordance with the teachings and principles disclosed herein.

Discrete wavelength tunable diode lasers typically comprise a semiconductor gain medium, two reflectors, a "static" etalon (or etalons) that defines a set of discrete equally-spaced wavelengths (channels), and a channel selecting mechanism that enables the laser output to comprise a single selectable wavelength from the set of wavelengths defined by the static etalon or etalons. For example, as an overview, a generalized embodiment of an external cavity diode laser (ECDL) 100 is shown in FIG. 1. ECDL 100 includes a gain medium comprising a diode gain chip 102. Diode gain chip 102 comprises a Fabry-Perot diode laser including a partially-reflective front facet 104 and an anti-reflective rear facet 106 coated with an anti-reflective (AR) coating to minimize reflections at its face. Optionally, diode gain chip 102 may comprise a bent-waveguide structure on the gain medium to realize the non-reflective rear facet 106. The external cavity elements include a diode intracavity collimating lens 108, tuning filter element or elements 110, and a reflective element 114. In general, reflective element 114 may comprise a mirror, grating, prism, or other reflector or retroreflector, which may also provide the tuning filter function in place of tuning element 110. The output side components include a diode output collimating lens 116, an optical isolator 118, and a fiber focusing lens 120, which focuses an output optical beam 122 such that it is launched into an output fiber 124.

The basic operation of ECDL 100 is a follows. A controllable current I is supplied to diode gain chip 102 (the gain medium), resulting in a voltage differential across the diode junction, which produces an emission of optical energy (photons). The emitted photons pass back and forth between partially-reflective front facet 104 and reflective element 114, which collectively define the ends of an "effective" laser cavity (i.e., the two reflectors discussed above), as depicted by laser cavity 126 in FIG. 1b. As the photons pass back and forth, a plurality of resonances, or "lasing" modes are produced. Under a lasing mode, a portion of the optical energy (photons) temporarily occupies the external laser cavity, as depicted by intracavity optical beam 126 and light rays 128; at the same time, a portion of the photons in the external laser cavity eventually passes through partially-reflective facet 104.

Light comprising the photons that exit the laser cavity through partially-reflective front facet 104 passes through diode output collimating lens 116, which collimates the light into output beam 122. The output beam then passes through optical isolator 118. The optical isolator is employed to prevent back-reflected light from being passed back into the external laser cavity, and is generally an optional element. After the light beam passes through the optical isolator, it is launched into the output fiber 124 by fiber focusing lens 120. Generally, output fiber 124 may comprise a polarization-preserving type or a single-mode type such as SMF-28.

Through appropriate modulation of the input current (generally for communication rates of up to 2.5 GHz) or through modulation of an external element disposed in the optical path of the output beam (not shown) (for 10 GHz and 40 GHz communication rates), data can be modulated on the output beam to produce an optical data signal. Such a signal may launched into a fiber and transmitted over a fiber-based network in accordance with practices well known in the optical communication arts, thereby providing very high bandwidth communication capabilities.

The lasing mode of an ECDL is a function of the total optical path length between the cavity ends (the cavity optical path length); that is, the optical path length encountered as the light passes through the various optical elements and spaces between those elements and the cavity ends defined by partially-reflective front facet 104 and reflective element 114. This includes diode gain chip 102, diode intracavity collimating lens 108, tuning filter elements 110, and cavity-length modulating element 112, plus the path lengths between the optical elements (i.e., the path length of the transmission medium occupying the ECDL cavity, which is typically a gas such as air). More precisely, the total optical path length is the sum of the path lengths through each optical element and the transmission medium times the coefficient of refraction for that element or medium.

As discussed above, under a lasing mode, photons pass back and forth between the cavity end reflectors at a resonance frequency, which is a function of the cavity optical path length. In fact, without the tuning filter elements, the laser would resonate at multiple frequencies. For simplicity, if we model the laser cavity as a Fabry-Perot cavity, these frequencies can be determined from the following equation:

$$Cl = \frac{\lambda x}{2n} \quad (1)$$

where λ=wavelength, Cl=Length of the cavity, x=an arbitrary integer—1, 2, 3, . . . , and n=refractive index of the medium. The number of resonant frequencies is determined from the width of the gain spectrum. The corresponding lasing modes for the cavity resonant frequencies are commonly referred to as "cavity modes," an example of which is depicted by cavity modes 200 in FIG. 2.

Figure 2:
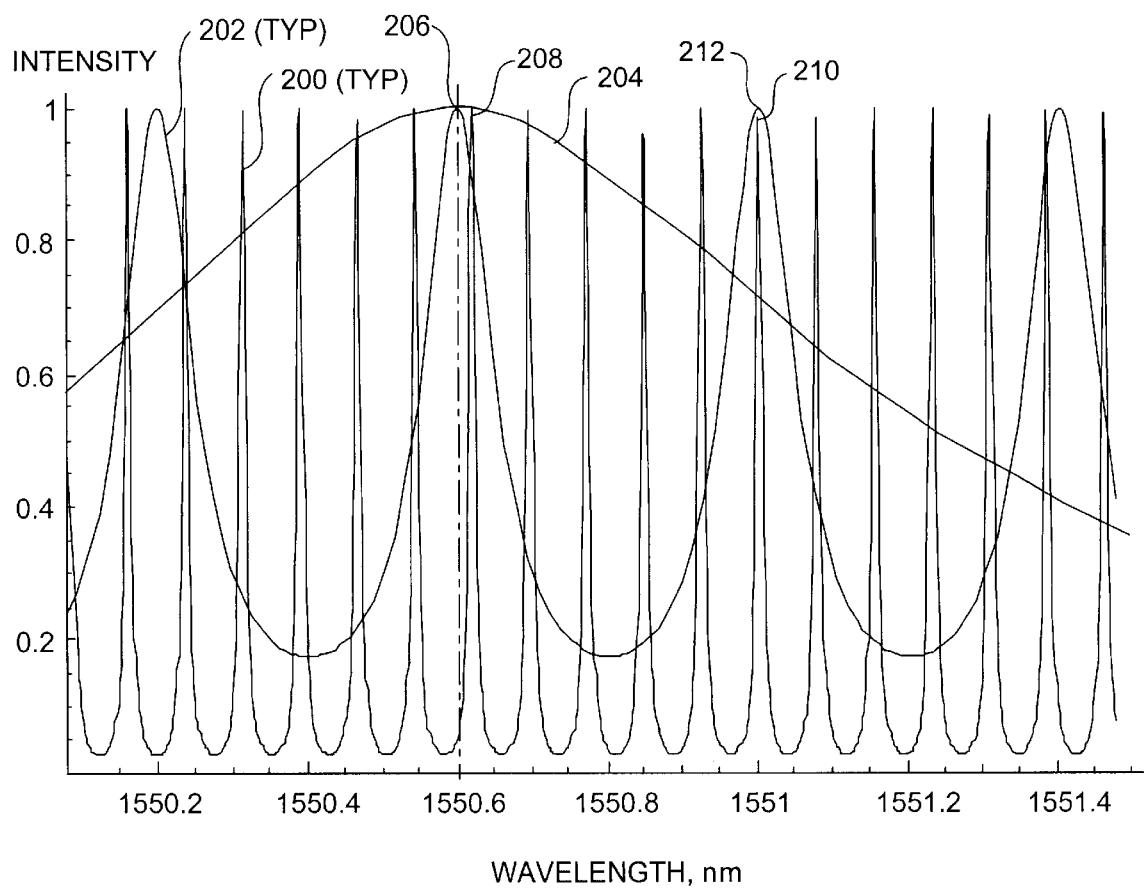
FIG. 2 is a diagram illustrating a relative position of a laser cavity's lasing modes with expect to transmission peaks defined by an intra-cavity etalon and channel selector.

In order to produce an output at a single wavelength (or frequency), filtering mechanisms are employed to substantially attenuate all lasing modes except for the lasing mode corresponding to the desired wavelength. As discussed above, in one scheme a pair of etalons, depicted as a grid generator 111 and a channel selector 112 in FIG. 1. The grid generator, which comprises a static etalon that operates as a Fabry-Perot resonator, defines a plurality of transmission peaks (also referred to as passbands) in accordance with equation (1). Ideally, during operation that transmission peaks remained fixed, hence the term "static" etalon; in practice, it may be necessary to employ a servo loop (e.g., a temperature control loop) to maintain the transmission peaks at the desired location. Since the cavity length for the grid generator is less than the cavity length for the laser cavity, the spacing (in wavelength) between the transmission peaks is greater for the grid generator than that for the cavity modes. A set of transmission peaks 202 corresponding to an exemplary etalon grid generator is shown in FIG. 2. Note that at the peaks of the waveform the intensity (relative in the figure) is a maximum, while it is a minimum at the troughs. Generally, the location and spacing of the transmission peaks for the grid generator will correspond to a set of channel frequencies defined by the communication standard the laser is to be employed for, such as the ITU channels and 0.04 nanometer (nm) spacing discussed above and depicted in FIG. 2. Furthermore, the spacing of the transmission peaks corresponds to the free spectral range (FSR) of the grid generator.

As discussed above, a channel selector, such as an adjustable etalon, is employed to select the lasing mode of the laser output. For illustrative purposes, in one embodiment channel selector 112 may comprise an etalon having a width substantially less than the etalon employed for the grid generator. In this case, the FSR of the channel selector is also substantially greater than that of the grid generator; thus the bandpass waveform of the channel selector is broadened, as illustrated by channel selector bandpass waveform 204 having a single transmission peak 206. In accordance with this channel selection technique, a desired channel can be selected by aligning the transmission peak of the channel selector (e.g. 206) with one of the transmission peaks of the grid generator. For example, in the illustrated configuration depicted in FIG. 2, the selected channel has a frequency corresponding to a laser output having a 1550.6 nm wavelength.

Note that in the illustrated example of FIG. 2, the transmission peak 208 of the cavity mode nearest the selected channel is misaligned with the transmission peaks for the grid generator and channel selector. As a result, the intensity of the laser output is attenuated due to the misalignment, which is reflected in the form of cavity losses. Various mechanisms may be employed to shift the cavity mode transmission peaks such that they are aligned with the grid generator and channel selector transmission peaks, thus yielding a maximum intensity in the laser output. Generally, under such schemes the optical path length of the laser cavity is adjusted so that it equals a multiple half-wavelength ($\lambda/2$) of the transmission wavelength selected by the grid etalon and channel selector (i.e., the wavelength at which grid etalon and channel selector transmission peaks are aligned). In one embodiment known as "wavelength locking," an electronic servo loop is implemented that employs a modulated excitation signal that is used to modulate the overall cavity optical path length, thereby producing wavelength and intensity modulations in the laser output. A detection mechanism is employed to sense the intensity modulation (either via a measurement of the laser output intensity or sensing a junction voltage of the gain medium chip) and generate a corresponding feedback signal that is processed to produce a wavelength error signal. The wavelength error signal is then used to adjust the unmodulated (i.e., continuous) portion of the overall cavity optical path length so as to align the transmission peak of the cavity mode with the transmission peaks of the grid generator and channel selector.

One mechanism for providing both channel selection and fine-tuning (i.e., wavelength locking) employs temperature control of the tuning elements. For example, with reference to FIG. 3, an ECDL 300 in shown including various elements common to ECDL 100 having like reference numbers, such as a gain diode chip 102, lenses 108, 116, and 120, etc. The various optical components of the ECDL 300 are mounted or otherwise coupled to a thermally-adjustable base or "sled" 316. In one embodiment, one or more thermal-electric cooler (TEC) elements 318, such as a Peltier element, are mounted on or integrated in sled 316 such that the temperature of the sled can be precisely controlled via an input electrical signal and temperature feedback servo loop. Due to the expansion and contraction of the sled material in response to a temperature change, the length of the sled can be adjusted very precisely by controlling its temperature via the electrical signal. Adjustment of the length results in a change in the distance between partially reflective front facet 104 and reflective element 114, which produces a change in the optical path length of the laser cavity. As a result, controlling the temperature of the sled can be used to provide fine adjustment of the frequency of the lasing mode, such as used in the channel-locking mode discussed above. Controlling the sled temperature is also applicable when starting up the laser from a non-operational state.

In general, temperature control of the sled will be used for very fine tuning adjustments, while coarser tuning adjustments will be made by means of tuning filter elements 110. Generally, tuning filter elements may comprise one or more etalons, gratings, prisms or other element or elements that are capable of providing feedback to gain medium 102 along at a selected wavelength or sets of wavelengths. The tuning filter element(s) 110 are controlled by a wavelength selection control block 342, which in turn is coupled to or included as part of a controller 320. In response to an input channel command 344, the controller and/or wavelength selection control block adjust the tuning filter element(s) so as to produce a lasing mode corresponding to the desired channel frequency.

In general, the tunable ECDLs may employ a wavelength-locking (also referred to as channel-locking) scheme so as to maintain the laser output at a selected channel frequency (and thus at a corresponding predetermined wavelength). Typically, this may be provided via a "phase modulation" scheme, wherein the optical path length of the laser cavity is modulated at a relatively low frequency (e.g., 500 Hz–20 KHz) at a small frequency excursion. In one embodiment, an optical path length modulator 313 (a.k.a. phase modulator) is employed for this purpose. In response to a modulated wavelength locking excitation signal 322 generated by controller 320 and amplified by an amplifier 324, the optical path length of modulator 313 is caused to modulate, thereby inducing a wavelength modulation in the laser's output. Generally, the optical path length modulator may comprise an element that changes its optical path length in response to an electrical input, such as a Lithium Niobate ($LiNbO_3$) phase modulator. Lithium Niobate is a material that changes its index of refraction (ratio of the speed of light through the material divided by the speed of light through a vacuum) when a voltage is applied across it. As a result, by providing a modulated voltage signal across the $LiNbO_3$ phase modulator, the optical path length of the external laser cavity can be caused to modulate. Other means of modulating the optical path length of the laser cavity may be employed as well, such as modulating the location of reflective element 114 (e.g., via a MEMS mirror or a reflector coupled to a piezo-electric actuator). Another technique is to employ a gain medium with a phase control section that changes its optical path length in response to an injected current that is separate from the drive current used to produce the gain medium's optical emission.

As is well-known, when the laser's output has a frequency that is centered on a channel frequency (in accordance with appropriately configured filter elements), the laser intensity is maximized relative to non-centered outputs. As a result, the wavelength modulation produces an intensity modulation having an amplitude indicative of how far off-center the lasing mode is. A corresponding feedback signal may then be generated that is received by controller 320 and processed to adjust the overall cavity length via a sled temperature control signal 330.

Figure 3:
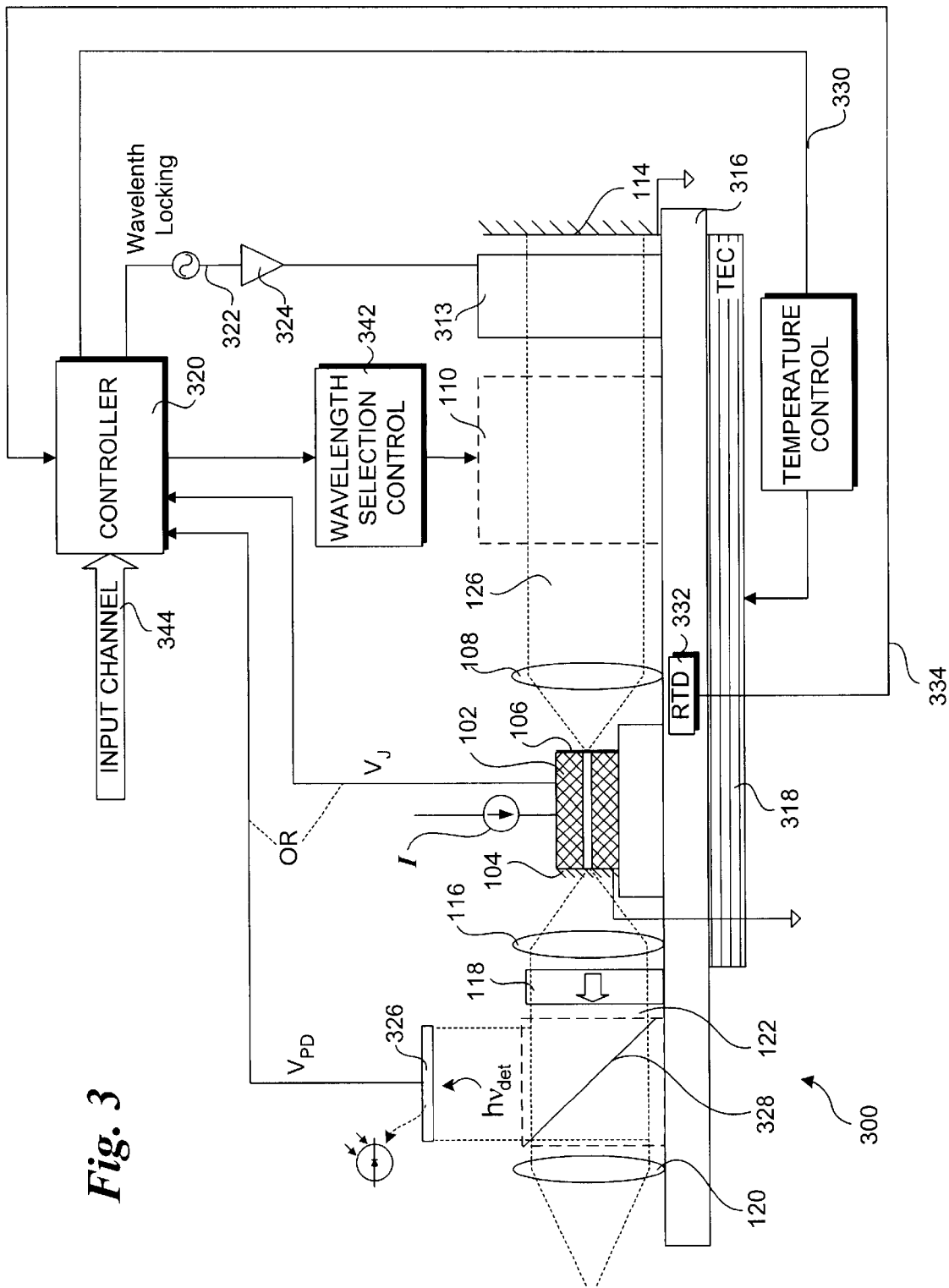
FIG. 3 is a schematic diagram of an external cavity diode laser (ECDL) in accordance with one embodiment of the invention in which various aspects of the invention may be implemented.

For example, in the illustrated embodiment of FIG. 3 a photodetector 326 is used to detect the intensity of the laser output. A beam splitter 328 is disposed in the optical path of output beam 122, causing a portion of the output beam light to be redirected toward photodetector 326. In one embodiment, photodetector 326 comprises a photo diode, which generates a voltage charge in response to the light intensity it receives ($hv_{det}$). A corresponding voltage $V_{PD}$ is then fed back to controller 320.

Controller 320 includes a digital servo loop (e.g., phase lock loop) that is configured to adjust the temperature of sled 316 such that the amplitude modulation of the light intensity detected at photodectector 326 is minimized, in accordance with a typical intensity vs. frequency curve for a given channel and corresponding filter characteristics. In an optional embodiment, the junction voltage across gain diode chip ($V_J$) is employed as the intensity feedback signal, rather than $V_{PD}$. An error signal is then derived by based on the amplitude modulation and phase of $V_{PD}$ or $V_J$ in combination with modulated signal 322. In response to the error signal, an appropriate adjustment in temperature control signal 330 is generated. Adjustment of the sled temperature causes a corresponding change in the overall (continuous) cavity length, and thus the lasing frequency. This in turn results in (ideally) a decrease in the difference between the lasing frequency and the desired channel frequency, thus completing the control loop. To reach an initial condition, or for a second feedback signal, a resistive thermal device (RDT) 332, such as a thermister or thermocouple, may be used to provide a temperature feedback signal 334 to controller 320.

In general, various tuning filter elements and corresponding tuning adjustment techniques may be employed for channel selection purposes. For example, in an ECDL 400 shown in FIG. 4, tuning filter elements 110 comprise first and second tunable filters $F_1$ and $F_2$. In one embodiment, filters $F_1$ and $F_2$ comprise respective etalons, either made of a solid material or being gas filled. In one embodiment, filter tuning is effectuated by changing the optical path length of each etalon. This in turn may be induced by changing the temperature of the etalons.

For example, ECDL 400 now shows further details of an exemplary channel selection subsystem. It is noted that although the wavelength selection control block 442 is shown external to controller 420, the control aspects of this block may be provided by the controller alone. Wavelength selection control block 442 provides electrical outputs 404 and 406 for controlling the temperatures of filters $F_1$ and $F_2$, respectively. In one embodiment, a temperature control element is disposed around the perimeter of a circular etalon, as depicted by TECs 408 and 410. Respective RTDs 412 and 414 are employed to provided a temperature feedback signal back to wavelength selection control block 442.

Generally, etalons are employed in laser cavities to provide filtering functions. As discussed above, they essentially function as Fabry-Perot resonators, and provide a filtering function defining a set of transmission peaks in the laser output. The FSR spacing of the transmission peaks is dependent on the distance between the two faces of the etalon, e.g., faces 416 and 418 for filter $F_1$, and faces 420 and 422 for filter $F_2$. As the temperatures of the etalons change, the etalon material is caused to expand or contract, thus causing the distance between the faces to change. This effectively changes the optical path length of the etalons, which may be employed to shift the transmission peaks.

The effect of the filters is cumulative. As a result, all lasing modes except for a selected channel lasing mode can be substantially attenuated by lining up a single transmission peak of each filter. In one embodiment, the configurations of the two etalons are selected such that the respective free spectral ranges of the etalons are slightly different. This enables transmission peaks to be aligned under a Vernier tuning technique similar to that employed by a Vernier scale. In one embodiment, one of the filters, known as a "grid generator," is configured to have a free spectral range corresponding to a communications channel grid, such as the ITU wavelength grid. This wavelength grid remains substantially fixed by maintaining the temperature of the corresponding grid generator etalon at a predetermined temperature. At the same time, the temperature of the other etalon, known as the channel selector, is adjusted so as to shift its transmission peaks relative to those of the grid generator. By shifting the transmission peaks of the filters in this manner, transmission peaks corresponding to channel frequencies may be aligned, thereby producing a cavity lasing mode corresponding to the selected channel frequency. In another embodiment, the transmission peaks of both the filters are shifted to select a channel.

Generally, either of these schemes may be implemented by using a channel-etalon filter temperature lookup table in which etalon temperatures for corresponding channels are stored, as depicted by lookup table 424. Typically, the etalon temperature/channel values in the lookup table may be obtained through a calibration procedure, through statistical data, or calculated based on tuning functions fit to the tuning data. In response to input channel selection 344, the corresponding etalon temperatures are retrieved from lookup table 424 and employed as target temperatures for the etalons using appropriate temperature control loops, which are well-known in the art.

Figure 4:
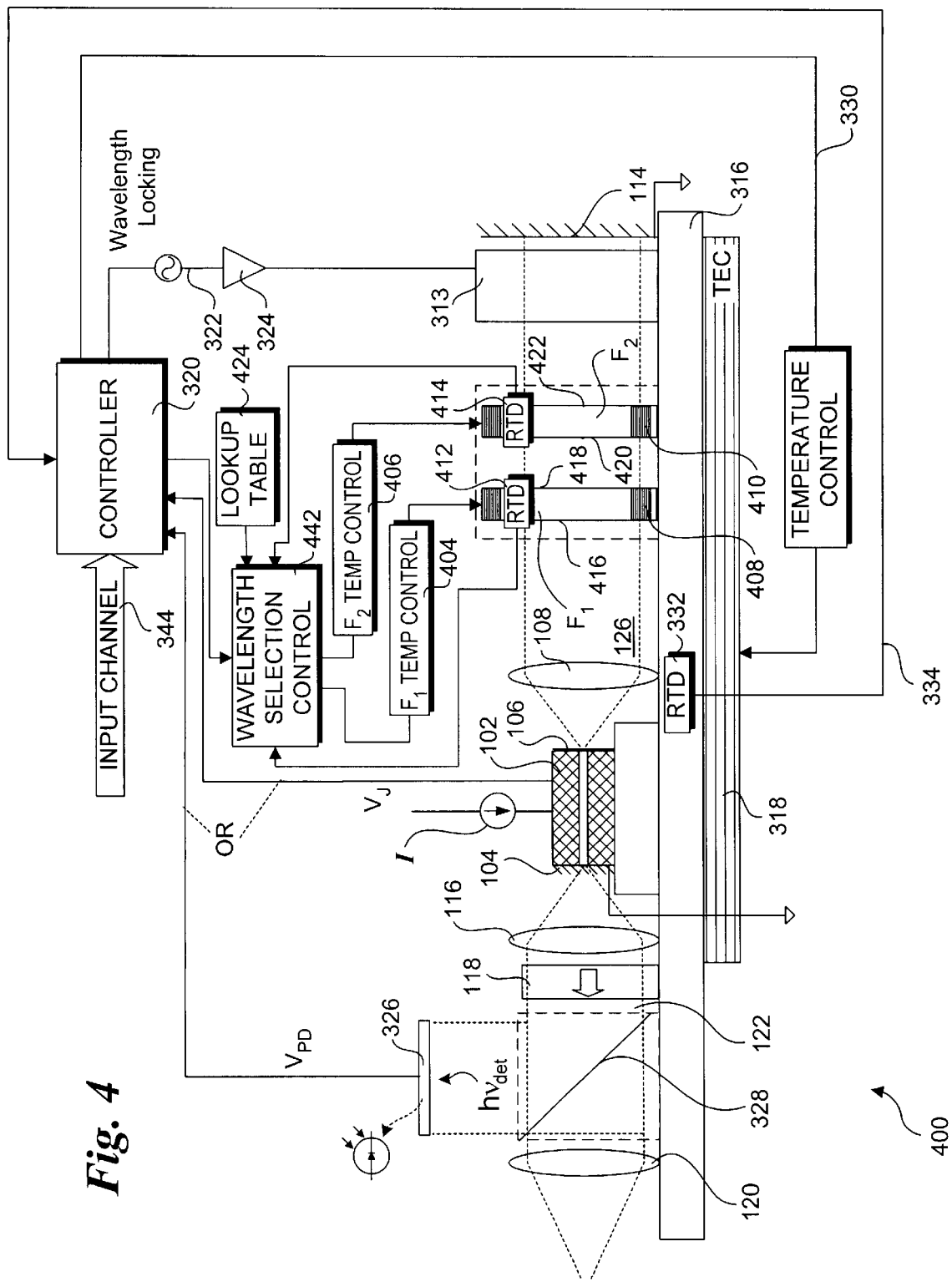
FIG. 4 is a schematic diagram of an ECDL illustrating further details of a channel selection scheme that employs a pair of adjustable etalons filters.

As illustrated in FIGS. 3 and 4, in one embodiment the temperatures of each of the etalon filters $F_1$ and $F_2$ and sled are controlled via respective servo loops that include thermoelectric coolers as temperature adjustment elements. TEC's, also known as Peltier devices or thermoelectric (TE) modules, are small solid-state devices that function as heat pumps. A "typical" unit is a few millimeters thick by a few millimeters to a few centimeters square. It is a sandwich formed by two ceramic plates with an array of small Bismuth Telluride cubes ("couples") in between. Other configurations may also be employed, such as cylindrical configurations for cylindrical-shaped etalons. When a DC current is applied heat is moved from one side of the device to the other—where it typically is removed with a heatsink. The "cold" side is commonly used to cool an electronic device. If the current is reversed the device makes an excellent heater.

Figure 5A:
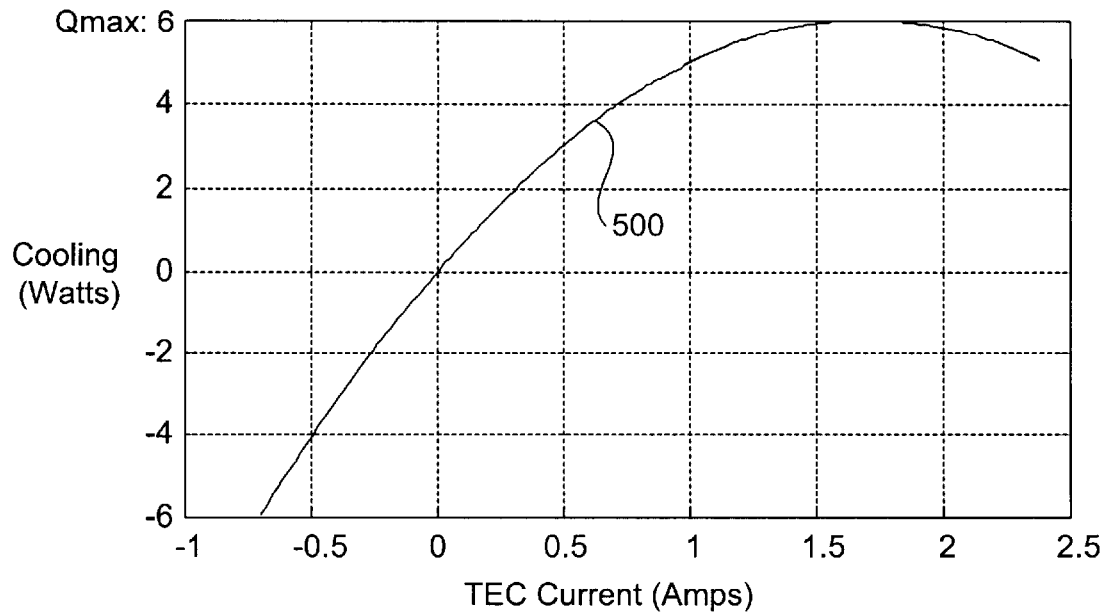
FIG. 5A is a graph illustrating a typical non-linear relationship between a thermoelectric cooler (TEC) drive current and its corresponding cooling rate.

TEC's are characterized as non-linear devices. That is, the relation between their output (cooling (heat dissipation) or heating (heat generation) rate) in response to an electrical input is non-linear. For example, a cooling rate vs. input current curve 500 for a typical TEC device is shown in FIG. 5A. As is clearly apparent from the curve, the input vs. output characteristics of the typical TEC device is very non-linear. In fact, there is a point on the curve at which a reversal occurs, whereby increasing the input current actually reduces the cooling level.

Figure 6:
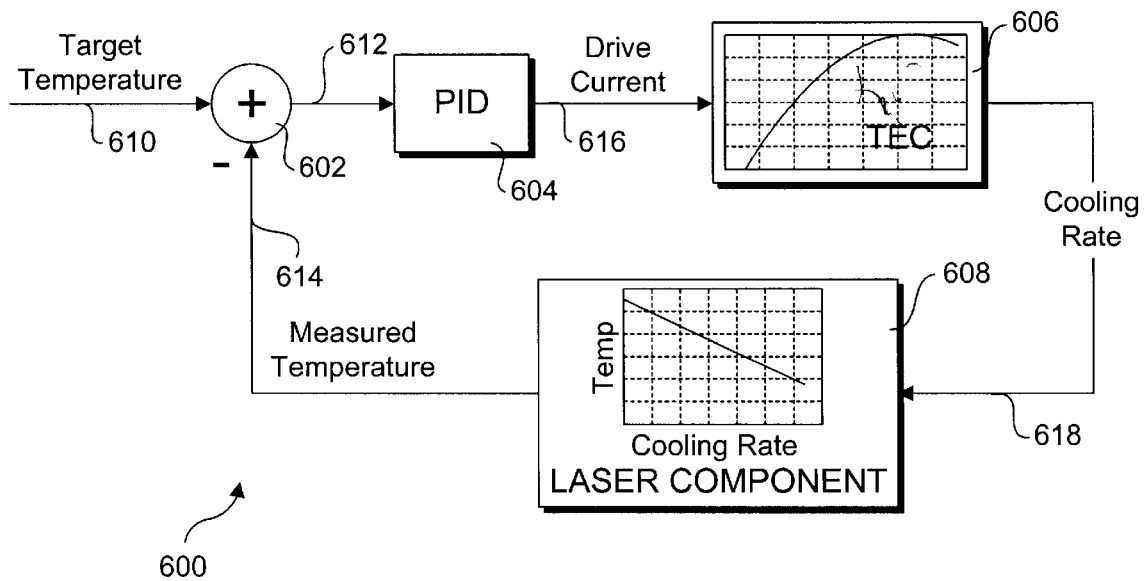
FIG. 6 is a schematic diagram of a conventional servo loop in which a TEC device is employed for controlling the temperature of a laser component.

A conventional servo loop 600 employed in the prior art for controlling the temperature of a laser component via a TEC is shown in FIG. 6. The servo loop includes a summing block 602, a PID (proportional, integral, and derivative) control block 604, a TEC transfer function block 606, and a laser component temperature transfer function block 608. The servo loop works in the following manner. A target temperature 610 is provided as an input to summing block 602. An error signal 612 is generated based on the difference between that target temperature and a temperature feedback signal 614 corresponding to a measured temperature of the laser component. The error signal 612 is received as an input by PID block 604, which generates a drive current signal 616 based on previous error signals as a function of the P, I, and D parameters for the block, as is well known in the control system arts. As an option, the PID block may be replaced by a PI block or simply a P block, although the best performance will generally be observed when a PID block is employed. The PID block could be replaced with a control block designed with a variety of methods know to those with skill in the art including a design based on state space methods.

The drive current signal 616 is received as an input to the TEC(s) attached to or integrated into the laser component being cooled. In accordance with the input vs. output transfer function depicted by TEC transfer function block 604, a cooling rate 618 is provided to the laser component based on the drive current. This cooling rate, in turn, lowers the temperature of the laser component in accordance with laser component temperature transfer function block 608. Generally, the applicable curve representing the temperature of the laser component vs. the cooling rate is substantially linear, as depicted in FIG. 6. The actual curve for the transfer function will depend on several parameters, including the temperature difference between the laser component and the ambient air surrounding the component, the size and configuration of any heat sinks that may be employed, the thermal mass of the laser component, etc.

The open loop gain of the servo loop is a function of the cooling level defined by the TEC transfer function (non-linear) in combination with the component temperature vs. cooling rate transfer function (substantially linear), and as such is non-linear. For instance, as the TEC current increases, the slope of the TEC transfer function curve decreases. This results in the loop gain decreasing with current. This non-linearity is usually not a problem when simply regulating the temperature of a component, since the TEC transfer function is substantially linear when only a small section of the curve is considered (corresponding to a regulated temperature condition). However, the non-linearity of the open loop gain becomes a problem when slewing to a new temperature. The open loop gain substantially corresponds to the slope of the TEC transfer function. Depending on where you are on the gain curve (e.g., at a low current point or a high current point), the loop response can be fast or slow, dependent on the open loop gain at that point. In contrast, the PID parameters are selected based on an averaged or target open loop gain that is fixed. As a result, the trajectory of the temperature may vary with the direction of travel. For instance, an arrival from a higher temperature will often undershoot the new target temperature, while an arrival from a lower temperature will often overshoot.

Figure 5B:
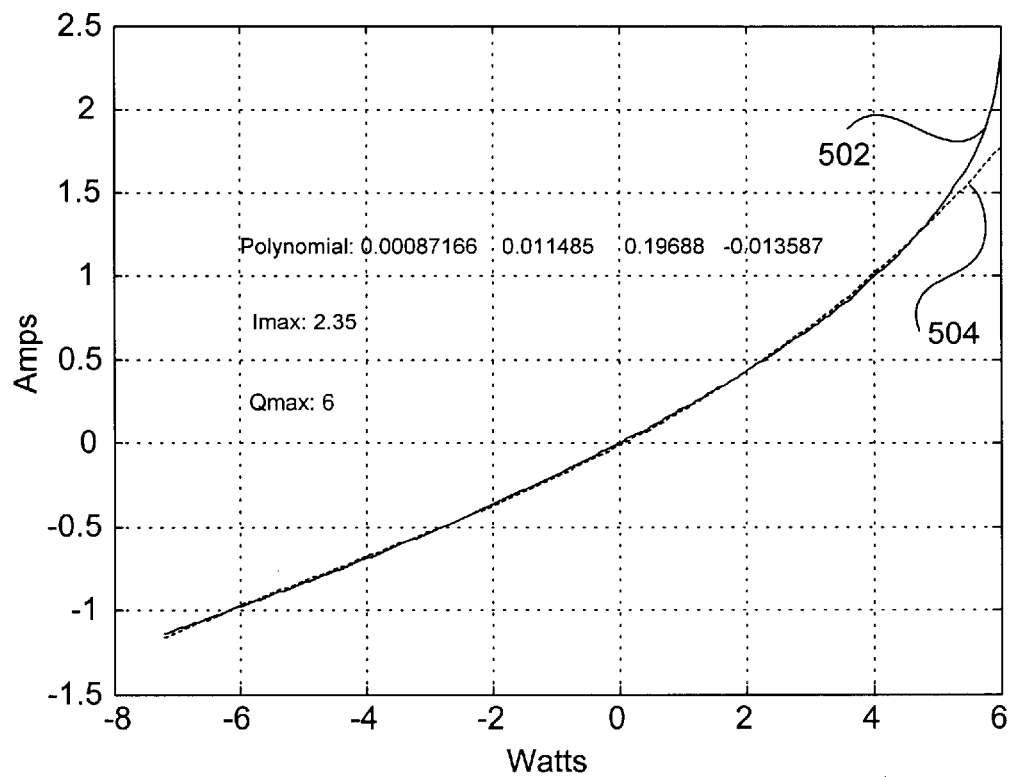
FIG. 5B is a graph illustrating an exemplary linearization curve corresponding to the TEC cooling rate vs. drive current curve of FIG. 5A.
Figure 7:
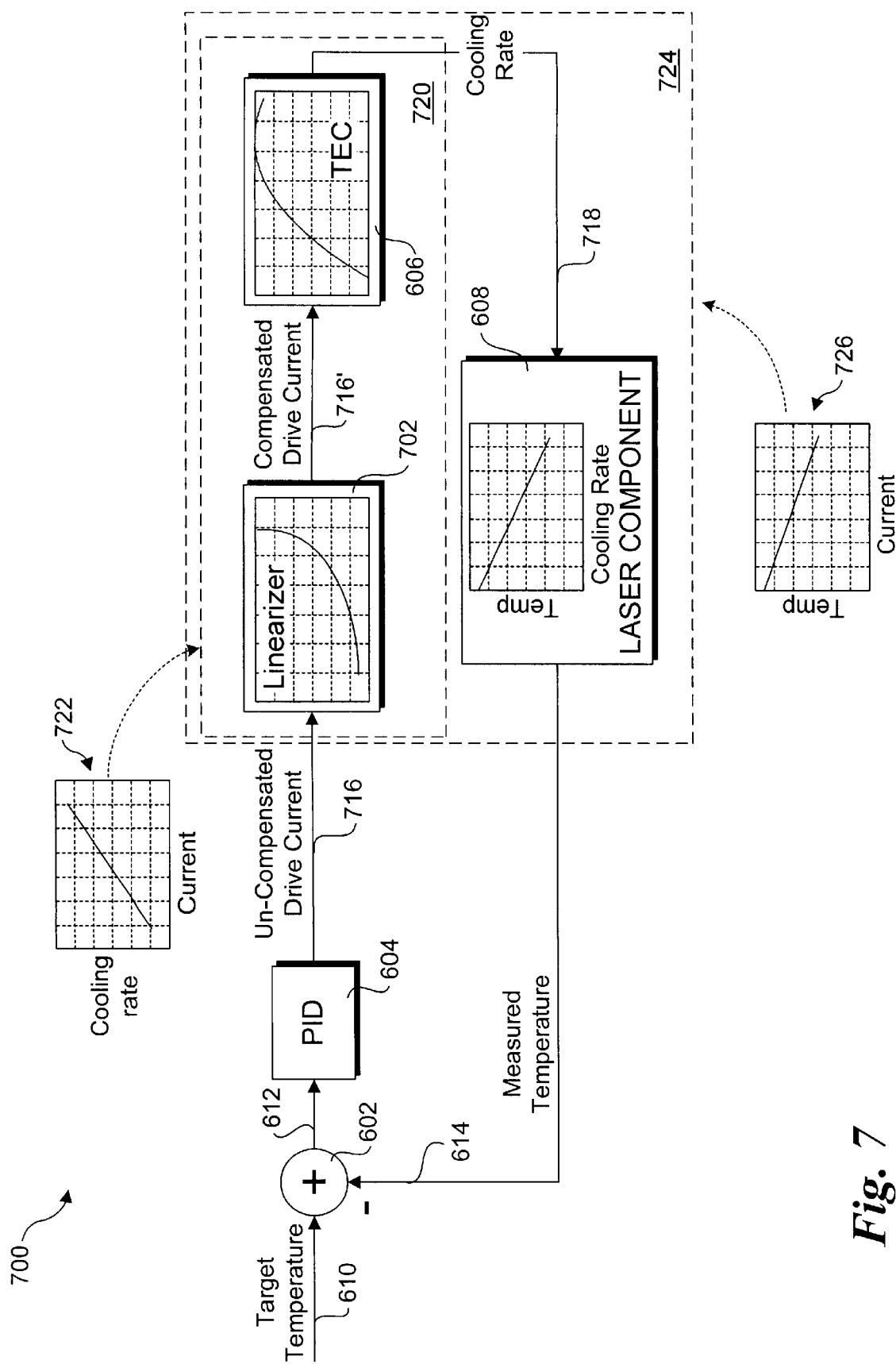
FIG. 7 is a schematic diagram of an improved servo loop in accordance with one embodiment of the invention in which a linearizer transfer function is employed to linearlize the non-linear behavior of a TEC device.

In accordance with aspects of the invention, an improved servo loop that "linearizes" the non-linear TEC transfer function is now disclosed. As shown in FIG. 7, the servo loop 700 employs a linearizer block 702 that resides between PID block 604 and TEC transfer function block 606. The linearizer block is used to linearize the transfer function of the TEC or linearize the combined transfer function of the TEC and the temperature vs. cooling rate transfer function of the laser component. The basic concept behind the linearizer block is that the combined transfer function of the loop is substantially linear, and thus the loop gain is substantially constant. Under such conditions, the PID parameters can be selected (or derived empirically) to produce excellent temperature slewing characteristics with minimal overshoot or undershoot. An exemplary linearizer curve 502 corresponding to the TEC cooling rate vs. input current curve 500 is shown in FIG. 5B.

In one embodiment, in order to determine an appropriate linearizer transfer function, the transfer function of the TEC or the combined TEC/laser component temperature transfer function is first determined. Generally, these transfer functions may be determined empirically, of may be obtained from data provided by the TEC manufacturer. In one embodiment, the TEC transfer function can be approximated as the following quadratic:

$$Q=2*I*Qmax/Imax-I^2*Qmax/Imax^2 \quad (2)$$

where Q is the cooling heat transfer rate in watts, I is the TEC current, Qmax is the maximum cooling rate for the TEC in watts, and Imax is the current corresponding to a Qmax cooling rate. The linearizer transfer function can then be derived such that the combination of the transfer functions produces a substantially linear transfer function having a substantially constant open loop gain.

In accordance with one embodiment, an "ideal" linearizer is characterized by the following equation:

$$I=Imax(1-\sqrt{(1-Q/Qmax)}) \quad (3)$$

Equation 3 may be employed as a linearizer function to produce a servo loop with a substantially constant open loop gain. Typically, a digital control system will be employed that implements the linearizer via software, as described below with reference to FIG. 8. When implemented in this matter, a couple notes are worthy of consideration. First, a square root function is expensive in terms of processor time. One scheme for overcoming this problem is to fit a polynomial equation to the curve defined by equation 3 and employ the polynomial equation in place of equation 3. Various software applications are available for generating polynomial equations to fit a known set of data, which may be defined in accordance with equation 3 and used as an input to derive the polynomial equation. Another scheme is to store the results of equation 3 for various input parameters in a lookup table that is stored in a non-volatile storage means, such as a ROM or Flash memory device.

A potential problem may result from the fact that when Q is close to Qmax and I is close to Imax, the slope of the linearizer is very high, as shown in the upper right-hand portion of FIG. 5B. If a particular TEC has an Imax higher than the design value used for the linearizer, the loop gain could be very high at the higher current levels. This may cause the system to oscillate. One technique for overcoming this problem is to straighten or otherwise reduce the increasing slop of the portion of the linearizer transfer function curve close to Qmax. For example, FIG. 7B shows a compensated linearization curve 504 corresponding to an un-compensated linearization curve 502. Another technique is to design the lineariser with Imax set to the highest value that is likely to be seen in a total population of TECs instead of using a nominal value. In general, techniques to make a lineariser robust in the presence of TEC-to-TEC variation will involve reducing the slope of the linearizer at higher Q and I levels.

Returning to the servo loop 700 of FIG. 7, the improved servo loop operates in the following manner. The output of the PID block 604 now comprises an un-compensated drive current 716. This un-compensated drive current is received as an input by linearizer block 702 and "transferred" into a compensated drive current 716', that is a drive current that compensates for the non-linearity of the TEC transfer function. This compensated drive current is then received as an input to TEC transfer function block 606, resulting in a cooling rate 718. The cooling rate produces a corresponding temperature based on the temperature vs. cooling rate transfer function in block 608, which is measured and employed for temperature feedback signal 614.

The net result of the improved servo loop is that the combination of the linearizer and TEC transfer functions, depicted by a dashed box 720, yields a linear composite transfer function 722. Optionally, when it is determined that there is sufficient non-linearity in the temperature vs. cooling rate transfer function for the laser component being cooled, the combined transfer function to be linearized may correspond to that transfer functions of blocks 702, 606, and 608, as depicted by a dashed line box 724 and a linear composite transfer function 726.

Figure 8:
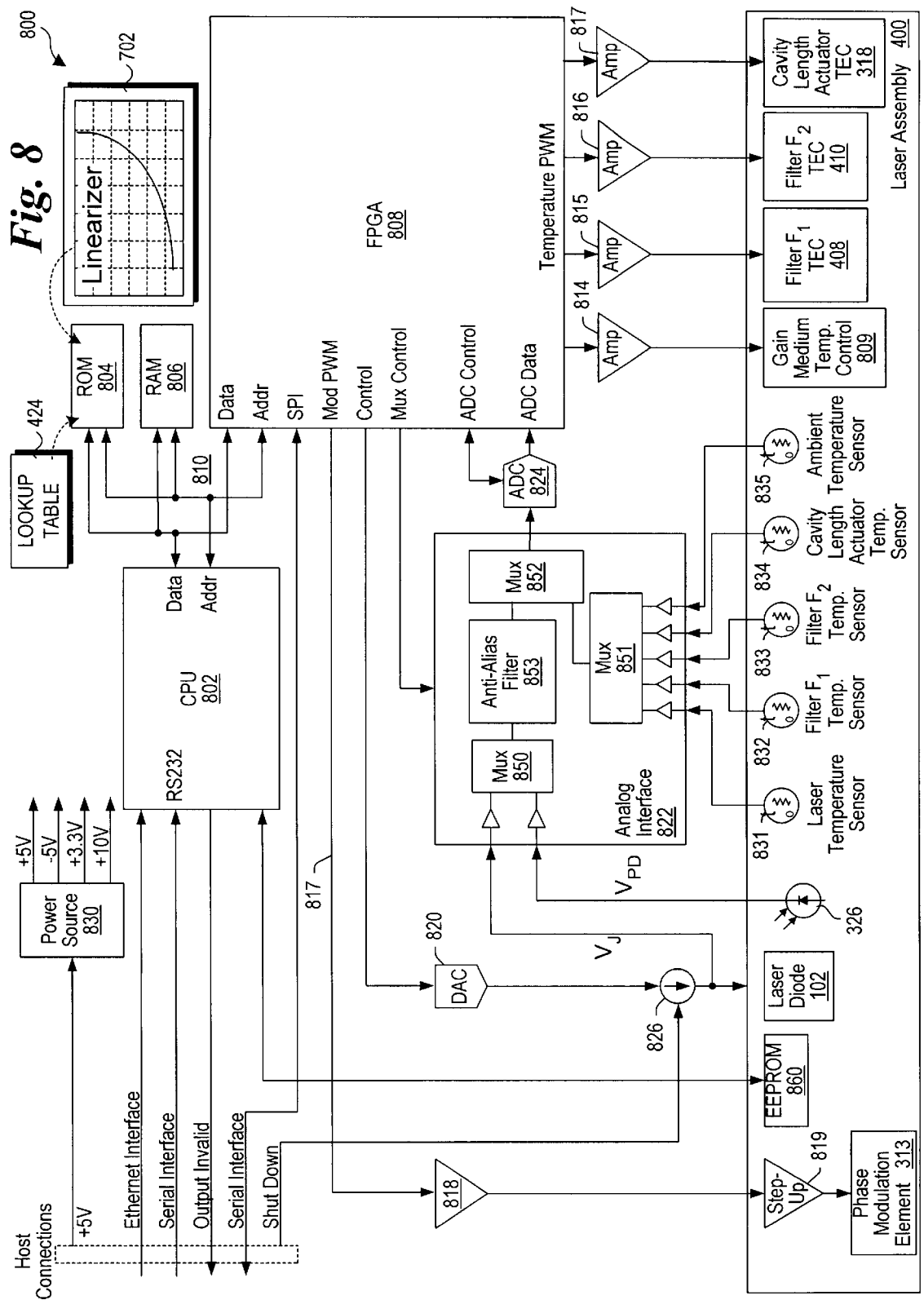
FIG. 8 is a schematic diagram illustrating various aspects of one embodiment of a laser controller via which the compensated temperature servo loop of FIG. 7 may be implemented.

FIG. 8 is a hardware block diagram illustrating various aspects of one embodiment of a laser controller that may be configured to implement the functionality of the temperature servo loops described herein. Various components of a laser assembly such as shown in ECDLs 100, 300, and 400 are also illustrated in FIG. 8; for simplicity and clarity these components share like-numbered references. It is noted that in other embodiments, various features of the laser controller of FIG. 8 as discussed below may be used in conjunction with other configurations of laser assemblies. Furthermore, such controllers and laser assemblies may omit various functionality as discussed above in conjunction with FIGS. 1–7.

The laser controller of FIG. 8 includes a microprocessor (CPU) 802 coupled through an interconnect bus 810 to a read-only memory (ROM) 804, a random access memory (RAM) 806 and a field programmable gate array (FPGA) 808. FPGA 808 is coupled to amplifiers 814–817, which are used to provide respective current inputs various TEC devices employed in the laser. FPGA 808 is further shown coupled to a digital-to-analog converter 820, an analog interface unit 822, and an analog-to-digital converter 824. A laser current source 826 is shown coupled to an output of digital-to-analog converter 820.

Power to the components of the laser controller illustrated in FIG. 8 is provided by a power source 830. In one embodiment, power source 830 receives 5 volt input power and generates output power of varying voltage levels to appropriately supply power to the components of controller 800. Power source 830 may be implemented using a high efficiency switching regulator circuit, or other types of voltage regulation circuits.

Microprocessor 802 and FPGA 808 operate concurrently and in cooperation with each other to perform various functionality as depicted in FIGS. 3, 4, and 7 and described herein. It is noted that operations performed by microprocessor 802 may be conducted in accordance with the execution of software code stored within ROM 804. In one embodiment, microprocessor 802 is implemented using a general purpose microprocessor, such as a Motorola MCF5206e microprocessor. It is noted that in other embodiments, a digital signal processor or other specialized hardware may be employed in place of microprocessor 802 and/or PFGA 808. It is further noted that in other embodiments, other programmable logic devices, such as a CPLD (Complex Programmable Logic Device) may be employed in the place of FPGA 808. Alternatively, one or more ASICs (Application Specific Integrated Circuits) could be employed. Still additional embodiments are contemplated that combine various functionality of microprocessor 802 and FPGA 808 as described herein within a single device, such as a microcontroller.

The laser controller may further include a network interface such as an Ethernet interface to allow control of the laser functionality by a remotely connected device. In one embodiment, the Ethernet functionality may be used to support an HTTP interface. Additionally, code for controlling operations of microprocessor 802 may be upgraded by downloading through an interface such as, for example, an RS-232 or Ethernet interface. This functionality allows for on-the-fly upgrades. Similarly, the logic configuration of FPGA 808 (or any other programmable logic device) may be modified through an interface such as an RS-232 or Ethernet interface using known techniques for performing such functions.

As illustrated in FIG. 8, ECDL 400 may include a laser temperature sensor 831 located in proximity to gain medium 102, a filter $F_1$ temperature sensor 832 (e.g., RTD 412) located in proximity to etalon filter $F_1$ (i.e., the grid generator), a filter $F_2$ temperature sensor 833 (e.g., RTD 414) located in proximity to etalon filter $F_2$, a cavity length actuator temperature sensor 834 (e.g., RTD 332) located in proximity to sled 316, and an ambient temperature sensor 835. Each of these temperature sensors may be implemented using a thermistor or similar device, although other types temperature sensing devices may be employed in other embodiments. ECDL 400 may further include one or more photodiodes, such as photodiode 326, positioned at selected locations of the laser to receive light associated with the laser's operation. In the illustrated embodiment, FPGA 808 may be programmed to periodically detect signals associated with each of temperature sensors 831–835, photodiode 326, and/or gain medium 102 through analog interface 822 and analog-to-digital converter 824. For this purpose, analog interface 822 includes multiplexers 850–852 and an anti-alias filter 853. Multiplexers 850–852 operate under the control of FPGA 808 to periodically couple a signal associated with a selected one of sensors 831–835, photodiode 326, or gain medium 102 for signal detection.

FPGA 808 is additionally configured to generate control signals for controlling various functionality of ECDL 400. More particularly, in the illustrated embodiment FPGA 808 is configured to generate respective control signals for driving TECs 408 and 410 to control the temperatures of etalon filters $F_1$ and $F_2$ in response to a channels selection input. As described above, temperature data vs. channel data is stored in lookup table 424, which in one embodiment resided in ROM 804. In response to a selected channel input received over the network interface, software running on CPU 802 retrieves the appropriate target temperatures for filters $F_1$ and $F_2$ to provide filtering functions to enable the laser to produce an output having a frequency corresponding to the desired channel controlling grid generator temperature controller (TEC) 408, which regulates the temperature of etalon filter F1.

FPGA 608 may similarly generate control signals for controlling a cavity length actuator temperature (e.g., TEC 318), which regulates the temperature of sled 316, and a gain medium temperature control element 809, which regulates the temperature of gain medium 102. In one embodiment, each of the temperature controllers are controlled by pulse-width modulated (PWM) signals generated by FPGA 808. In one specific implementation, the pulse-width modulated signals are generated at a repetition rate of 200 kHz. Amplifiers 814–817 are provided to amplify the PWM signals generated by FPGA 808. It is noted that in alternative embodiments, other forms of control signals may be generated to control selected functions of ECDL 400.

FPGA 808 may further be configured to generate a modulation signal for driving phase modulation element 313. For this purpose, FPGA 808 may be configured to generate a pulse-width modulated signal which is input to a low-pass filter 818 which correspondingly provides an analog modulation signal that is passed to an amplifier 819. In one particular implementation, the modulation signal provided from the output of low-pass filter 818 is in the form of a sinusoidal wave at 20 kHz. The PWM signal generated by FPGA 808 may have a frequency consistent with that of the other PWM signals generated by FPGA 808. For example, in one embodiment, the PWM signal has a frequency of 200 KHz.

The sampling of signals associated with sensors 831–835, photodiode 326, and/or gain medium 102 may be performed synchronously with the generation of the PWM control signals that drive the temperature controllers as well as the PWM signal provided to low pass filter 818. The precise timing and synchronization of the control signals with the detected signals reduces the potential noise sources to a DC offset by mixing the fundamental component down to 0 or DC. The DC offsets can be subtracted from the signal in interest.

Generally, the amplitude of the modulation detected photodiode 326 ($V_{PD}$) or represented by the modulation of the gain medium diode junction voltage $V_J$ indicates the magnitude of correction or adjustment required for the optical path length of the laser external cavity, while the phase of the voltage signal modulation relative to the phase modulation drive signal indicates the direction of the adjustment. Accordingly, in one embodiment $V_J$ is periodically measured by FPGA 608 through analog interface 622 and analog-to-digital converter 624, while in another embodiment $V_{PD}$ is periodically measured. Either of these voltage signals may be amplified with a pre-amp within analog interface 822 (e.g., a transimpedance amplifier) and then multiplexed through multiplexer 850 into a common anti-alias filter 853. Multiplexer 852 is set to provide the output of anti-alias filter 853 to analog-to-digital converter 824.

In one embodiment, operation of a TEC control loop occurs in the following manner. For the purpose of clarity, the operation of a single temperature servo loop corresponding to controlling the temperature of filter $F_1$ will be described further, noting that a similar servo loop is employed for concurrently controlling the temperature of filter $F_2$ and/or controlling the temperature of the laser sled 316. In response to a channel selection input, corresponding target temperature for filters $F_1$ and $F_2$ are retrieved by CPU 802 from lookup table 424. In an optional embodiment, the various lookup table data may be loaded into RAM 806 during a startup operation, and thus the lookup table temperatures would be retrieved from RAM 806 instead of ROM 804. This target temperature corresponds to target temperature 610 in FIG. 7.

During ongoing operations, FPGA periodically generates a temperature value corresponding to an electrical output of filter F1 temperature sensor 832 via appropriate control inputs to analog interface 822 and ADC 824. These temperature values may be temporarily stored in the FPGA, or may be periodically loaded into RAM 806 by the FPGA. The temperature values represent the measured temperature feedback signal 614. Based on the difference between the target temperature and the measured temperature, an error signal 612 is generated and processed by PID block 604 to produce un-compensated drive current 716. In accordance with the illustrated digital control scheme, the functions performed by PID block 604 may be implemented via software running on CPU 802. Optionally, this functionality may be provided via "hard-coded" circuitry, such as provided by FPGA 808 or another device, such as an ASIC. Software programming for performing PID control functions, as well as PI, PD, and P control functions are known in the art, so no further details are provided herein. In one embodiment, the parameters (multipliers) for each of the P, I, and D elements are stored in ROM 804 and retrieved during startup operations.

Next, the un-compensated drive current, which will comprise a digital value at this point, is transformed via linearizer transfer function block 702. In a manner similar to the PID block, the linearizer transfer function may be performed via software executing on CPU 802, or via hard-coded circuitry. As discussed above, in one embodiment the linearizer transfer function is represented by equation 3, which may be implemented directly, or modeled using a corresponding polynomial equation. Optionally, one or more lookup tables may be used to store data relating to the linearizer transfer function, wherein the data may be either numerically or empirically derived.

As discussed above, the linearizer transfer function transforms the un-compensated drive current 716 (value) into a compensated drive current 716' (value). This drive current value, which is calculated by the software-implemented servo loop, is forwarded to FPGA 808 through appropriate data, address, and control signals, whereupon a PWM signal corresponding to the drive current value is automatically generated and amplified by amplifier 815 to drive filter $F_1$ TEC 408. In another embodiment, a DAC and following amplifier is employed to generate a continuous drive current for the TEC.

Returning to FIG. 8, ECDL 400 may further include an EEPROM (electrically erasable programmable read-only memory) 460 or other non-volatile storage device (e.g., Flash memory) for storing information particular to the laser. EEPROM 460 may be embodied upon the same base or within the same housing that includes elements forming the external cavity laser assembly (e.g., including gain medium 102), and separate from, for example, a printed circuit board upon which the hardware associated with controller 800 is mounted. Data may be stored within EEPROM 860 that contains information relevant to wavelength calibration, tuning hints such as temperatures or positions, power or temperature calibration factors, identifying numbers, and operating data. The operating data may contain, for example, information relevant to laser lifetime, such as time-current profiles, as well as linearizer and/or PID parameter information. By storing this information in a non-volatile device that is integral to ECDL 400, interchangeability between ECDLs and controller boards may be supported while retaining device-specific data.

In one embodiment, calibration coefficients associated with temperature sensors 831–835 are stored within EEPROM 860. The calibration coefficients may represent deviations from nominal values of the temperature sensors. For example, each of the temperature sensors 831–835 may nominally have the same value of resistance at ambient temperature. However, due to specific device variations, the actual values associated with individual sensors may deviate from the nominal value. The calibration coefficients may represent the relative differences between the resistances of temperature sensors 831–835 when each is measured at an equal ambient temperature. These calibration coefficients may be stored in EEPROM 860 following manufacture of the laser assembly, and may be used to scale temperature measurements taken from the sensors.

Figure 9:
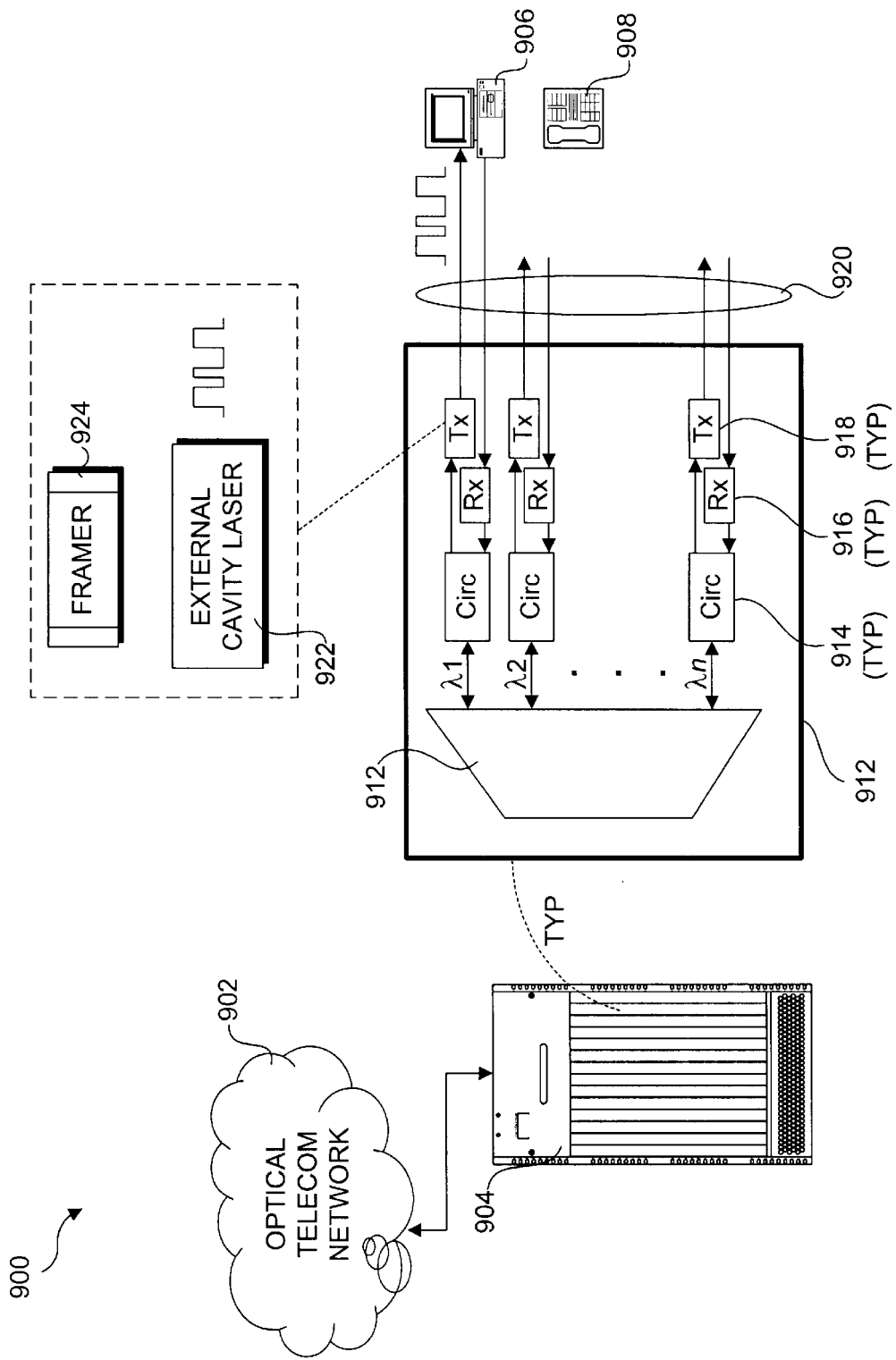
FIG. 9 is a schematic diagram of a communication network including a network switch in which tunable external cavity lasers in accordance with embodiments of the invention may be deployed.

FIG. 9 shows a communication system 900 in accordance with an embodiment of the invention in which an optical network is coupled to a plurality of data and voice subscribers lines by an optical mux/demux utilizing ECDL's tunable to the center frequency of any of the WDM channels on the optical network. The communication system includes an optical network 902, a network switch 904, a data terminal 906, and a voice terminal 908. The modulated data may be carried on a number of channels in multiple access protocols including but not limited to: wavelength division multiplexing (WDM), dense wavelength division multiplexing (DWDM), frequency division multiple access (FDMA), etc. Currently, this expansion of bandwidth is primarily being accomplished by WDM, in which separate subscriber/data session may be handled concurrently on a single optical fiber by means of modulation of each of those subscriber datastreams on different portions of the light spectrum. The precise center frequencies of each channel are specified by standard setting organizations such as the International Telecommunications Union (ITU). The center frequencies are set forth as part of a wavelength grid that defines the center frequencies and spacing between channels. Typically, the grid spacing is even and occurs at integer multiples of a selected fundamental frequency.

Network switch 904 provides network switching operations, as is well-known in the art. This is facilitated by optical transceivers that are mounted on fiber line cards 910. Each fiber line card includes a multi-state multiplexer/demultiplexer (mux/demux) 912, a circulator bank including circulators 914, a receiver bank including receivers 916, and a transmitter bank including transmitters 918. The mux/demux is a passive optical device that divides wavelengths (or channels from a multi-channel optical signal, or combines various wavelengths (or channels) on respective optical paths into one multi-channel optical signal depending on the propagation direction of the light.

In the receive mode, after de-multiplexing, each individual channel is passed via a corresponding circulator 914 within the circulator bank to a corresponding receiver 916 in the receiver bank. Each receiver 916 includes a narrow bandpass photodetector, framer, and decoders (not shown). Switches (not shown) couple the receiver over a corresponding one of subscriber lines 920 to a voice or data terminal 906 or 908, respectively.

In the transmit mode, each line card transmitter bank includes a bank of lasers 922, including n (e.g., 128) ECDLs radiating light at one of the selected center frequencies of each channel of the telecommunications wavelength grid. The wavelength range of current ITU-defined grids is 1525–1575 nm. Each subscriber datastream is optically modulated onto the output beam of a corresponding ECL having a construction and operation in accordance with the embodiments of the invention discussed above. A framer 924 permits framing, pointer generation and scrambling for transmission of data from the bank of ECDLs and associated drivers. The modulated information from each of the lasers is passed via a corresponding circulator into mux/demux 912, which couples the output to a single optical fiber for transmission. The operation of the fiber line card in the embodiment shown is duplex, meaning that bi-directional communications are possible.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A laser apparatus, comprising:
   a gain medium pumped to emit an optical emission in response to an electrical input;
   a laser cavity optically coupled to the gain medium;
   a thermo electric cooling (TEC) element having a non-linear heat transfer vs. input current characteristic;
   a temperature adjustable component thermally coupled to the TEC element, to effect a change in a characteristic of an optical output produced by the laser apparatus in response to a change in the temperature of the component; and
   a control loop to control the temperature of the temperature adjustable component via a current input to the TEC element; said control loop including a linearizer to compensate for the non-linear heat transfer vs. current characteristic of the TEC element to produce a gain condition under which the temperature of the temperature adjustable component is controlled as a substantially linear function of the current input to the TEC.

2. The laser apparatus of claim 1, wherein the gain medium comprises a Fabry-Perot diode chip having a partially-reflective facet and non-reflective facet and the laser cavity is defined by the reflective facet and a reflective element, each of which are operatively coupled to a base comprising the temperature adjustable component, and wherein the control loop is used to adjust an optical path length of the laser cavity by controlling the temperature of the base.

3. The laser apparatus of claim 1, wherein the temperature adjustable component comprises an optical element disposed in the laser cavity to which the TEC element is thermally coupled, said optical element to effectuate tuning of the optical output of the laser apparatus.

4. The laser apparatus of claim 3, wherein the optical element comprises an etalon filter.

5. The laser apparatus of claim 3, wherein the optical element comprises a grid generator.

6. The laser apparatus of claim 3, wherein the optical element comprises a channel selector.

7. The laser apparatus of claim 1, wherein the linearizer comprises a control block that receives an un-compensated drive current signal as an input and produces a compensated drive current signal as an output that is used to drive the TEC element such that a cooling rate output of the TEC element is substantially linear with respect to a value of the un-compensated drive current signal.

8. The laser apparatus of claim 7, wherein the linearizer control block comprises a digital control block that selects a compensated drive current signal value from a lookup table based on a corresponding un-compensated drive current signal value.

9. The laser apparatus of claim 7, wherein the linearizer control block comprises a digital control block that provides a transfer function corresponding to a mathematical equation via which a compensated drive current signal value output is generated in response to an un-compensated drive current signal value input.

10. The laser apparatus of claim 9, wherein a transfer function of the linearizer control block is characterized by the equation $$I = I\max(1 - \sqrt{1.31\ Q/Q\max})$$

wherein I is an compensated drive current signal, Imax is the drive current corresponding to a maximum cooling rate, Qmax, of the TEC element, and Q corresponds to a cooling rate produced by the TEC element when driven with an uncompensated drive current signal.

11. The laser apparatus of claim 1, wherein the control loop comprises a digital control loop.

12. The laser apparatus of claim 11, wherein the control loop is effectuated by a controller comprising:
   a non-volatile memory in which linearizer data are stored; and
   a processor coupled to the non-volatile memory, to effectuate the control loop via processing the linearizer data.

13. A laser apparatus, comprising:
   a gain medium pumped to emit an optical emission in response to an electrical input;
   a laser cavity optically coupled to the gain medium;
   first and second filters, disposed in the laser cavity
   first and second thermo electric cooling (TEC) elements, thermally coupled to the first and second filters, respectively, each having a non-linear heat transfer vs. current characteristic; and
   first and second control loops to control the temperature of the first and second filters, respectively, via respective current inputs to the first and second TEC element; each of said first and second control loops including a linearizer to compensate for the non-linear heat transfer vs. current characteristic of the TEC element to which it corresponds to produce a gain condition under which the temperature of the respective filter is controlled as a substantially linear function of the current input to the TEC element.

14. The laser apparatus of claim 13, wherein the first filter comprises a grid generator and the second filter comprises a channel selector.

15. The laser apparatus of claim 13, wherein the first and second filters comprise first and second etalons.

16. The laser apparatus of claim 15, wherein the first and second etalons produce respective sets of transmission passbands having slightly different spacings, and tuning of an output of the laser apparatus is effectuated by adjusting the temperature of the first and/or second etalon via the first and second TEC elements to align a passband of the first etalon with a passband of the second etalon in accordance with a Vernier tuning technique.

17. The laser apparatus of claim 13, wherein the gain medium comprises a Fabry-Perot diode chip having a partially-reflective facet and non-reflective facet and the laser cavity is defined by the partially-reflective facet and a reflective element, further comprising:
 a base to which each of the gain medium and the reflective element are operatively coupled;
 a third TEC element, thermally coupled to the base; and
 a third control loop, to adjust an optical path length of the laser cavity by controlling the temperature of the base, said third control loop including a linearizer to compensate for a non-linear heat transfer vs. input current characteristic of the third TEC element.

18. The laser apparatus of claim 13, wherein the linearizer in each of the first and second control loops comprises a control block that receives an un-compensated drive current signal as an input and produces a compensated drive current signal as an output that is used to drive a corresponding TEC element such that a cooling rate output of the TEC element is substantially linear with respect to a value of the un-compensated drive current signal.

19. The laser apparatus of claim 13, further comprising a controller to effectuate the first and second control loops, said controller to receive an input channel command and control the temperature of the first and second filters to produce a laser output having a wavelength corresponding to the input channel command.

20. The laser apparatus of claim 19, wherein the controller comprises:
 a non-volatile memory in which linearizer data are stored; and
 a processor coupled to the non-volatile memory, by which the first and second control loops are effectuated via processing the linearizer data.

21. The laser apparatus of claim 20, further comprising a field programmable gate array (FPGA) coupled to the processor.

22. The laser apparatus of claim 20, further comprising a network interface coupled to or built into the processor.

23. A method for tuning a laser, comprising:
 adjusting the temperature of a tuning component in the laser via a control loop by controlling a current input to a thermal electric cooler (TEC) element thermally coupled to the tuning component, wherein the current input is controlled by linearizing an open loop gain of the control loop to compensate for a non-linear cooling rate output vs. current input characteristic of the TEC element.

24. The method of claim 23, wherein the control loop comprises a digital control loop, and wherein the open loop gain of the control loop is linearized by altering an un-compensated drive signal produced internally by the control loop to produce a compensated drive signal such that when the compensated drive signal is used to drive the TEC element the cooling rate produced by the TEC element is substantially linear with a value of the un-compensated drive signal.

25. The method of claim 24, wherein the value of the compensated drive signal is produced by selecting a value from a lookup table defined for a corresponding to the un-compensated drive signal value.

26. The method of claim 24, wherein the value of the compensated drive signal is produced based on a mathematical formula defining a relationship between an uncompensated drive signal value and a compensated drive signal value.

27. The method of claim 26, wherein the mathematical formula is based on the equation $$I = I\max(1 - \sqrt{1 - Q/Q\max})$$

wherein I is an compensated drive current signal, Imax is the drive current corresponding to a maximum cooling rate, Qmax, of the TEC element, and Q corresponds to a cooling rate produced by the TEC element when driven with an uncompensated drive current signal.

28. An apparatus, comprising:
 a control loop to control the temperature of a temperature adjustable component via a current input to a thermal electric cooler (TEC) element having a non-linear heat transfer vs. current characteristic; said control loop including:
  a linearizer to compensate for the non-linear heat transfer vs. current characteristic of the TEC element; and
  an input at which a target temperature for the temperature adjustable component is provided;
  feedback input at which a measured temperature of the temperature adjustable component is receive;
  wherein the linearizer effects an open loop gain under which the temperature of the temperature adjustable component is controlled as a substantially linear function of the current input to the TEC.

29. The apparatus of claim 28, wherein the linearizer comprises a control block that receives an uncompensated drive signal as an input and produces a compensated drive signal as an output that is used to drive the TEC element such that a cooling rate output of the TEC element is substantially linear with respect to a value of the un-compensated drive signal.

30. The apparatus of claim 29, wherein the linearizer control block comprises a digital control block that selects a compensated drive current signal value from a lookup table based on a corresponding un-compensated drive current signal value.

31. The apparatus of claim 29, wherein the linearizer control block comprises a digital control block that provides a transfer function corresponding to a mathematical equation via which a compensated drive current signal value output is generated in response to an un-compensated drive current signal value input.

32. The apparatus of claim 31, wherein a transfer function of the linearizer control block is characterized by the equation $$I = I\max(1 - \sqrt{1 - Q/Q\max})$$

wherein I is an compensated drive current signal, Imax is the drive current corresponding to a maximum cooling rate, Qmax, of the TEC element, and Q corresponds to a cooling rate produced by the TEC element when driven with an uncompensated drive current signal.

33. The apparatus of claim 28, wherein the control loop comprises a digital control loop.

34. The laser apparatus of claim 33, wherein the control loop is effectuated by a controller comprising:

a non-volatile memory in which linearizer data are stored; and a processor coupled to the non-volatile memory, to effectuate the control loop via processing the linearizer data.

35. The apparatus of claim 28, wherein a linearization curve corresponding to the linearizer is adjusted to lower the loop gain to compensate for part-to-part variances in TEC's to be driven by the apparatus.

* * * * *

UNITED STATES PATENT AND TRADEMARK OFFICE
CERTIFICATE OF CORRECTION

PATENT NO. : 6,667,998 B1
DATED : December 23, 2003
INVENTOR(S) : Lo et al.

It is certified that error appears in the above-identified patent and that said Letters Patent is hereby corrected as shown below:

Column 15,
Line 52, before "current characteristic", delete "input".

Column 16,
Line 41, delete "$I = Imax(1- \sqrt{131Q/Qmax})$", insert -- $I = Imax(1 - \sqrt{(1-Q/Qmax)})$ --.

Column 17,
Line 33, before "current", delete "input".

Signed and Sealed this

Fourth Day of May, 2004

JON W. DUDAS
*Acting Director of the United States Patent and Trademark Office*